United States Patent
Nagaishi

(10) Patent No.: US 12,289,929 B2
(45) Date of Patent: Apr. 29, 2025

(54) INFRARED DEVICE COMPRISING MESA PORTION INCLUDING THREE LATERAL SURFACES FORMING SPECIFIED ANGLES WITH SUBSTRATE FACE

(71) Applicant: Asahi Kasei Microdevices Corporation, Tokyo (JP)

(72) Inventor: Taisei Nagaishi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 415 days.

(21) Appl. No.: 17/645,513

(22) Filed: Dec. 22, 2021

(65) Prior Publication Data

US 2022/0209035 A1   Jun. 30, 2022

(30) Foreign Application Priority Data

Dec. 24, 2020 (JP) ................................. 2020-214602
Nov. 4, 2021 (JP) ................................. 2021-180604

(51) Int. Cl.
| | | |
|---|---|---|
| H01L 31/0352 | (2006.01) | |
| H10F 30/10 | (2025.01) | |
| H10F 71/00 | (2025.01) | |
| H10F 77/14 | (2025.01) | |
| H10H 20/01 | (2025.01) | |
| H10H 20/821 | (2025.01) | |

(52) U.S. Cl.
CPC ........... *H10F 77/147* (2025.01); *H10F 30/10* (2025.01); *H10F 71/00* (2025.01); *H10H 20/01* (2025.01); *H10H 20/821* (2025.01)

(58) Field of Classification Search
CPC . H01L 31/035281; H01L 31/09; H01L 31/18; H01L 33/005; H01L 33/24; H01L 33/36; H01L 33/44; H01L 2933/0016; H01L 2933/0025; H01L 31/02161; H01L 33/20; H01L 31/105
See application file for complete search history.

(56) References Cited

U.S. PATENT DOCUMENTS

| | | |
|---|---|---|
| 2009/0206357 A1 | 8/2009 | Ito et al. |
| 2010/0301440 A1 | 12/2010 | Watanabe et al. |

(Continued)

FOREIGN PATENT DOCUMENTS

| | | |
|---|---|---|
| CN | 101120452 A | 2/2008 |
| CN | 101656210 A | 2/2010 |

(Continued)

*Primary Examiner* — Davienne N Monbleau
*Assistant Examiner* — John Patrick Cornely
(74) *Attorney, Agent, or Firm* — KENJA IP LAW PC

(57) ABSTRACT

An infrared device comprises a first mesa portion. The lateral surface of the first mesa portion includes a first lateral surface located on a side close to a bottom surface of the first mesa portion, a second lateral surface located above the first lateral surface, and a third lateral surface located above the second lateral surface. A first angle $\theta_1$ formed by the first lateral surface and one face of the substrate is 0.6° or more and less than 45°, a second angle formed by the second lateral surface and one face of the substrate is 45° or more and 90° or less, and a third angle $\theta_3$ formed by a third lateral surface and one face of the substrate is 0.6° or more and less than 45°. $W_3/W_2$ is 0.15 or more and $W_1/W_2$ is 0.2 or more and 3.0 or less.

10 Claims, 8 Drawing Sheets

(56) References Cited

U.S. PATENT DOCUMENTS

| | | |
|---|---|---|
| 2019/0280158 A1 | 9/2019 | Sung et al. |
| 2020/0335664 A1 | 10/2020 | Niwa et al. |

FOREIGN PATENT DOCUMENTS

| | | |
|---|---|---|
| JP | H07193277 A | 7/1995 |
| JP | 2004271518 A | 9/2004 |
| JP | 2004281815 A | 10/2004 |
| JP | 2010283013 A | 12/2010 |
| JP | 2011119383 A | 6/2011 |
| JP | 2017183633 A | 10/2017 |
| TW | 202044614 A | 12/2020 |
| WO | 2020016578 A1 | 1/2020 |

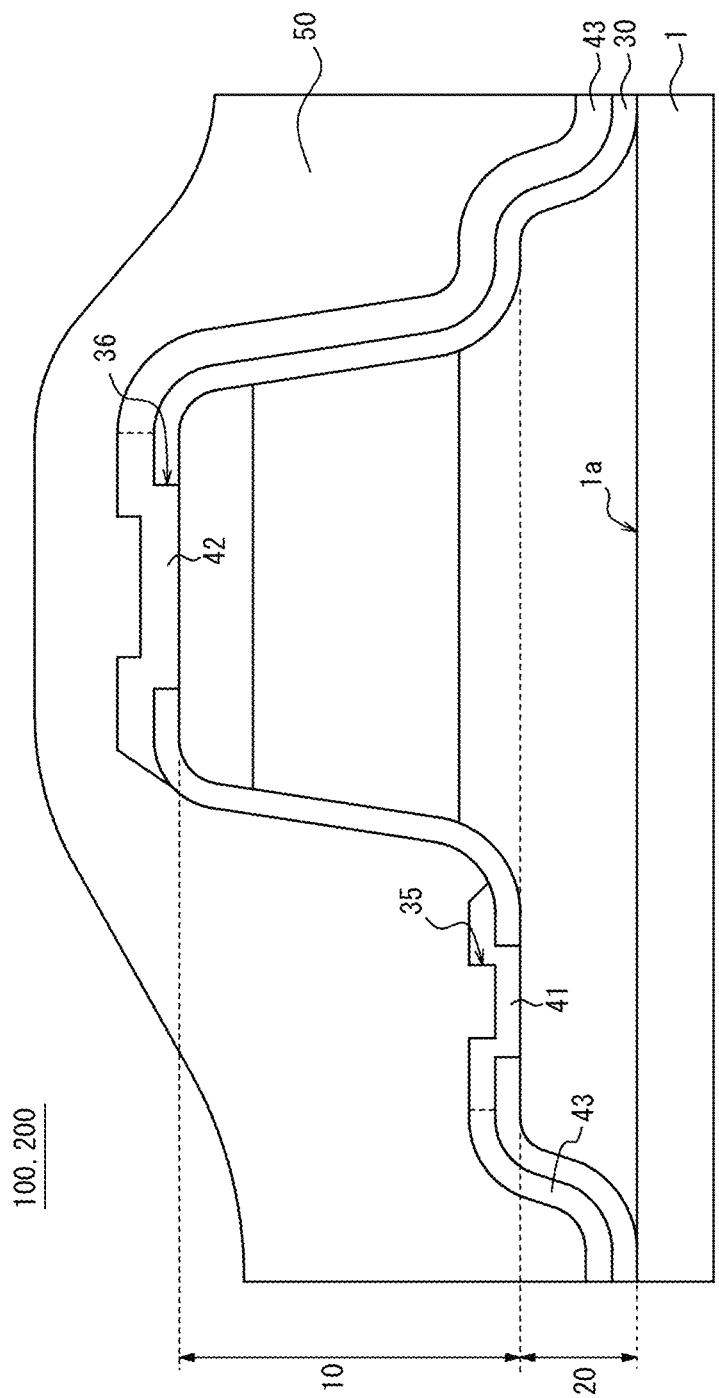

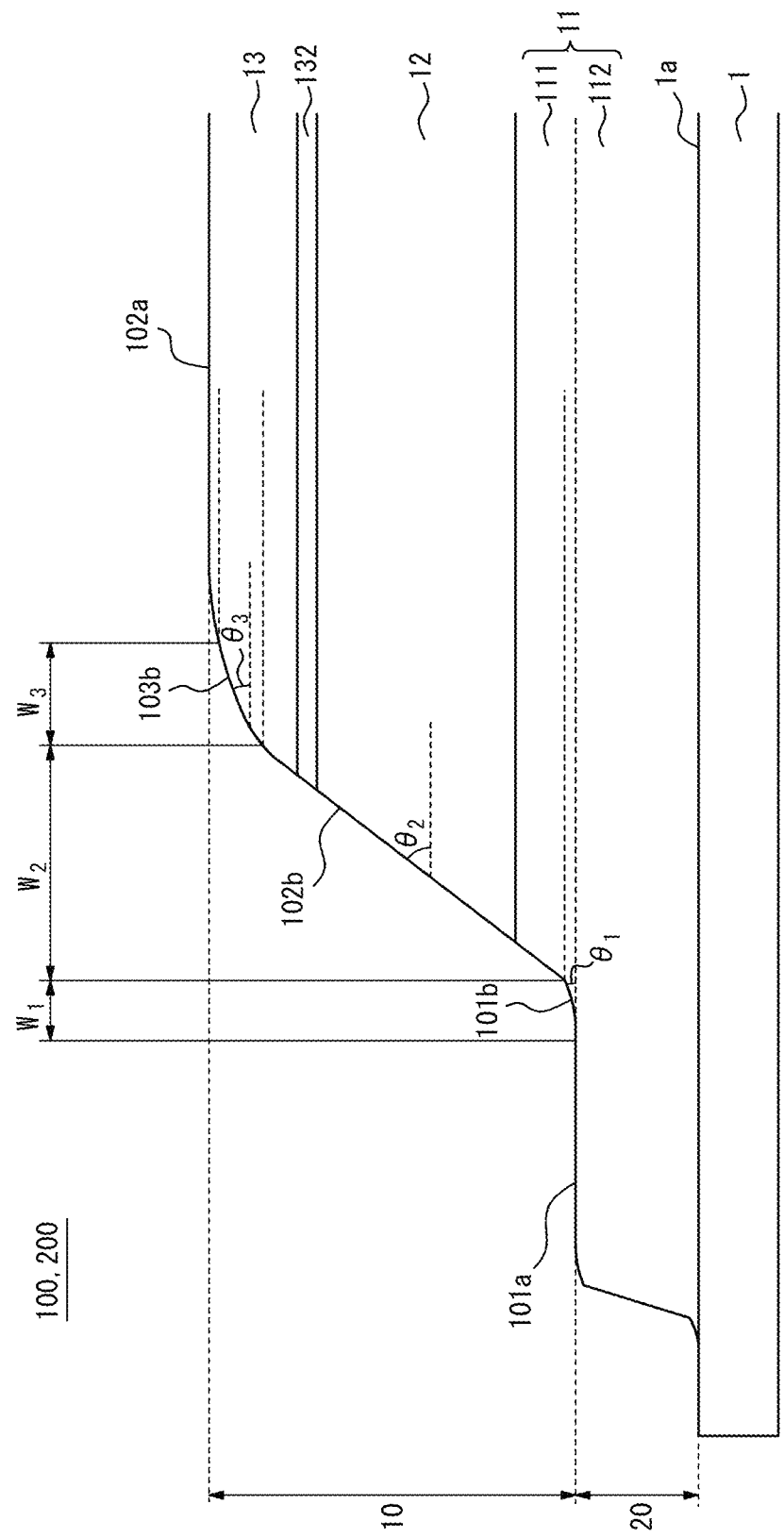

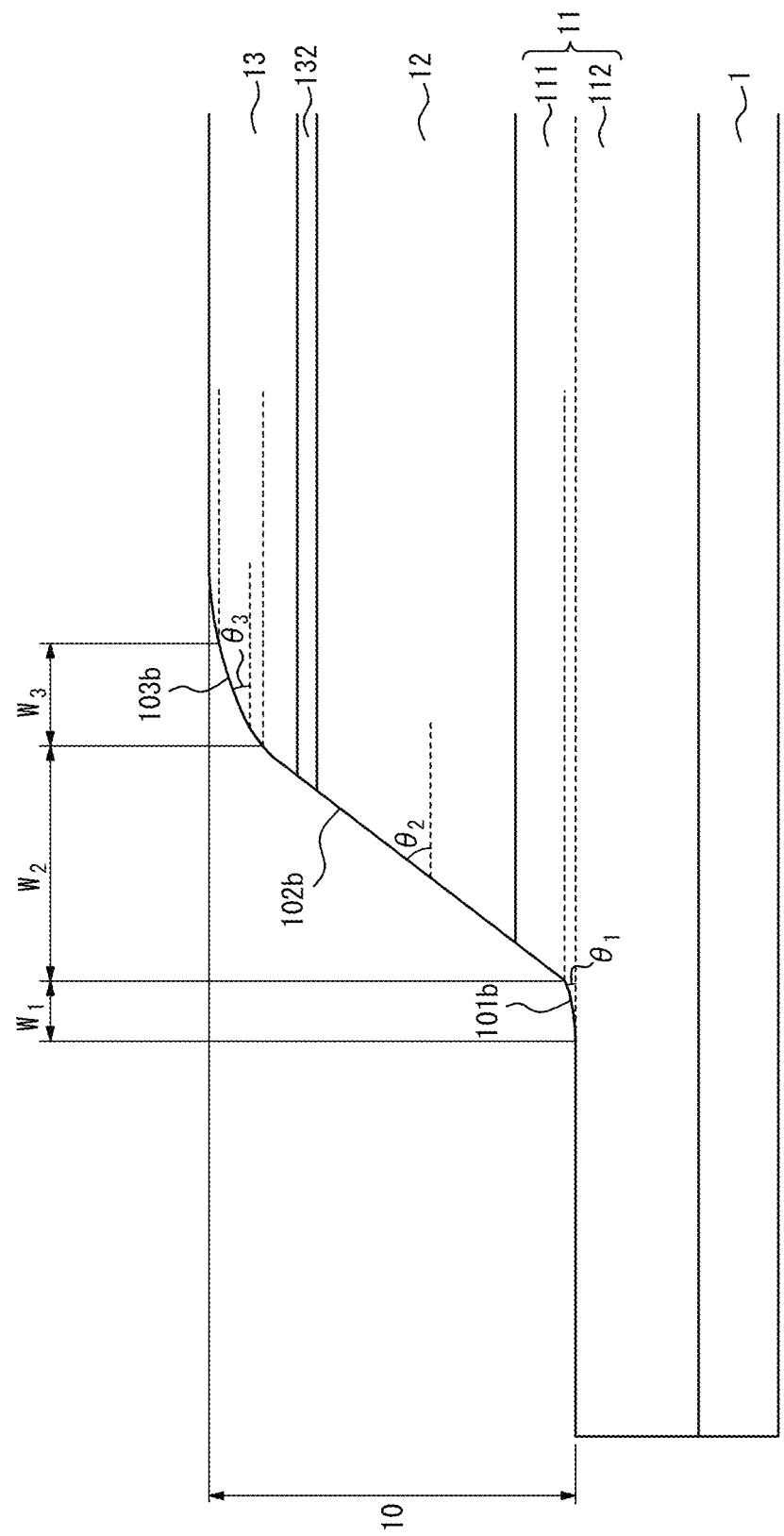

INFRARED DEVICE COMPRISING MESA PORTION INCLUDING THREE LATERAL SURFACES FORMING SPECIFIED ANGLES WITH SUBSTRATE FACE

CROSS-REFERENCE TO RELATED APPLICATION

This application claims priority to and the benefit of Japanese Patent Application Nos. 2020-214602 (filed on Dec. 24, 2020) and 2021-180604 (filed on Nov. 4, 2021), the entire contents of which are incorporated herein by reference.

TECHNICAL FIELD

This disclosure relates to infrared devices and a method of manufacturing infrared device light receiving elements.

BACKGROUND

As an infrared device, an infrared light receiving element that outputs a signal according to the received infrared light and an infrared light emitting element that emits infrared light according to the input power are known. In a quantum infrared light receiving element, infrared light is detected by the photocurrent generated by absorption of infrared light by a semiconductor having a PN junction or a PIN junction. The infrared light receiving element is also referred to as an infrared sensor. Further, the quantum infrared light receiving element is used for human sensors for detecting infrared light emitted from human bodies and non-contact temperature sensors. The infrared light emitting element emits infrared light by a voltage applied in the forward direction. The infrared light emitting element is also referred to as an infrared light emitting diode or an infrared LED. These elements can be used, for example, for a non-dispersive infrared (NDIR) gas sensor (for example, PTL 1). The NDIR gas sensor can measure the gas concentration using an infrared light receiving element that receives infrared light in the absorption wavelength band corresponding to the gas to be detected and an infrared light emitting element that emits infrared light in that absorption wavelength band.

CITATION LIST

Patent Literature

PTL 1: JP2004-271518A

SUMMARY

Technical Problem

In recent years, infrared devices have become increasingly popular and have a wide range of applications. In particular, in the field of sensing technology, there is a need for sensors with an even higher accuracy, and it is necessary to improve the performance of infrared light receiving elements and infrared light emitting elements. Some quantum infrared light receiving elements and infrared light emitting elements have a pin diode structure of a compound semiconductor using materials such as Al, P, Ga, As, In, and Sb. In this case, photoelectric conversion is performed in an i layer, that is, an active layer, so it is effective to increase the volume of the active layer to improve the photoelectric conversion efficiency.

On the other hand, when the thickness of an i layer is increased in order to increase the volume of the active layer, there arises a processing problem such as deterioration of coating properties of the insulating layer and the electrode portion.

Further, when a compound semiconductor layer is provided on a substrate and a diode shape is formed by the wet etching method, corrosion holes called etch pits are generated on the surface starting from lattice defects introduced between the substrate and the semiconductor layer. Furthermore, when the wet etching method is used, the etching proceeds isotropically, resulting in a formation of a gentle tapered shape on the etching side, and the volume of the active layer is reduced.

It is therefore an object of this disclosure to provide an infrared device with improved photoelectric conversion efficiency and a method of manufacturing an infrared light receiving element of the infrared device.

Solution to Problem

An infrared device according to an embodiment has a first mesa portion including: a first semiconductor layer of first conductive type provided on one face side of a substrate; a second semiconductor layer serving as an active layer stacked on the first semiconductor layer; and a third semiconductor layer of second conductive type stacked on the second semiconductor layer, wherein,
  a lateral surface of the first mesa portion includes a first lateral surface located on the side close to a bottom surface of the first mesa portion, a second lateral surface located above the first lateral surface and a third lateral surface located above the second lateral surface;
  a first angle formed by the first lateral surface and one face of the substrate is 0.6° or more and less than 45°, a second angle formed by the second lateral surface and one face of the substrate is 45° or more and 90° or less, and a third angle formed by the third lateral surface and one face of the substrate is 0.6° or more and less than 45°; and
  when a length in the direction parallel to the surface of the substrate formed by the first lateral surface is defined as $W_1$, a length in the direction parallel to the surface of the substrate formed by the second lateral surface is defined as $W_2$, and a length in the direction parallel to the surface of the substrate formed by the third lateral surface is defined as $W_3$, $W_3/W_2$ is 0.15 or more and $W_1/W_2$ is 0.2 or more and 3.0 or less.

A method of manufacturing an infrared device according to an embodiment includes:
  a step of forming a first semiconductor layer of first conductive type on one face side of a substrate;
  a step of forming a second semiconductor layer serving as an active layer on the first semiconductor layer;
  a step of forming a third semiconductor layer of second conductive type on the second semiconductor layer;
  a first etching step of forming a first mesa portion including an upper side portion of the first semiconductor layer, the second semiconductor layer and the third semiconductor layer by applying a dry etching process with an interelectrode voltage 330V or higher; and
  a second etching step of applying a dry etching process with an interelectrode voltage less than 330V.

Advantageous Effect

According to the infrared device of this disclosure, an infrared device with improved photoelectric conversion efficiency and a method of manufacturing an infrared light receiving element of the infrared device can be provided.

BRIEF DESCRIPTION OF THE DRAWINGS

In the accompanying drawings:

FIG. 1 is a cross-sectional view illustrating a configuration example of an infrared device according to an embodiment;

FIG. 2 is a cross-sectional view schematically illustrating a configuration example of a first mesa portion and a second mesa portion of the infrared device according to an embodiment;

FIG. 3D is a cross-sectional view illustrating a method of manufacturing the infrared device;

DETAILED DESCRIPTION

Figure 3A:
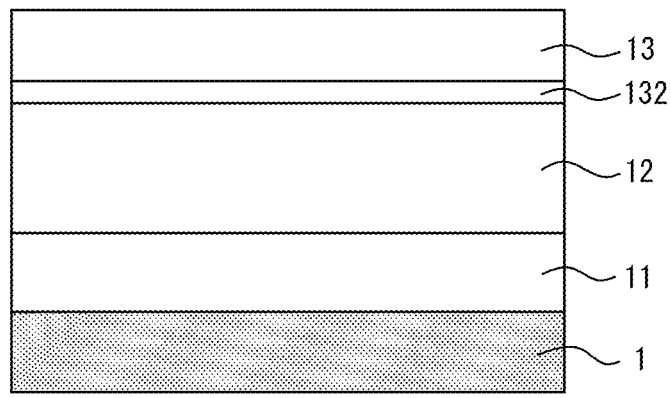
FIG. 3A is a cross-sectional view illustrating a method of manufacturing the infrared device.

An infrared light receiving element 100 according to an embodiment of this disclosure will be described below using drawings. Here, an infrared light emitting element 200 can be configured with the same configuration as the infrared light receiving element 100 described below. That is, the configuration of the infrared light receiving element 100 described in this embodiment can be a structure of the infrared light emitting element 200 as it is. In other words, in this embodiment, each configuration of these infrared devices will be described by using the infrared light receiving element 100 as a representative. Further, the infrared light emitting element 200 can be manufactured by the same method as a method of manufacturing the infrared light receiving element 100 described below. That is, the method of manufacturing the infrared light receiving element 100 described below can be a method of manufacturing the infrared light emitting element 200 as it is, and together a method of manufacturing the infrared device is described.

In each of the figures described below, the parts corresponding to each other are designated by the same reference signs, and descriptions of the duplicating parts will be omitted as appropriate. Further, this embodiment exemplifies a configuration for embodying the technical idea of this disclosure, and does not specify the material, shape, structure, arrangement, dimensions, etc. of each part to the following. The technical idea of this disclosure can be modified in various ways within the technical scope defined by the claims.

<Infrared Light Receiving Element>
(1) Configuration

FIG. 1 is a cross-sectional view illustrating a configuration example of an infrared light receiving element 100 according to an embodiment of this disclosure (hereinafter referred to as this embodiment). As illustrated in FIG. 1, the infrared light receiving element 100 includes a first mesa portion 10 provided on one face (hereinafter referred to as a surface) 1a side of a substrate 1, a second mesa portion 20 provided below the first mesa portion 10 on a surface 1a side of the substrate 1, an insulating film 30 that continuously covers the first mesa portion 10 and the second mesa portion 20, a first electrode 41 joined to a top surface of the second mesa portion 20 through a first contact hole 35 provided in the insulating film 30, a second electrode 42 joined to a top surface of the first mesa portion 10 through a second contact hole 36 provided in the insulating film 30, and a wiring portion 43 integrally formed with the first electrode 41 and the second electrode 42. Here, FIG. 1 illustrates a state where a passivation film 50 that covers the infrared light receiving element 100 is provided on the surface 1a side of the substrate 1. The passivation film 50 is an insulating protective film. Here, the boundary surface of the first mesa portion 10 with the second mesa portion 20 may be referred to as a bottom surface of the first mesa portion 10. In FIG. 1, the bottom surface of the first mesa portion 10 is illustrated with a dashed line.

FIG. 2 is a cross-sectional view schematically illustrating a configuration example of the first mesa portion 10 and the second mesa portion 20 of the infrared light receiving element 100. The first mesa portion 10 includes an upper side portion 111 of a first semiconductor layer 11 of first conductive type, a second semiconductor layer 12 stacked on the first semiconductor layer 11 and a third semiconductor layer 13 of second conductive type stacked on the second semiconductor layer 12. Here, the second semiconductor layer 12 is an active layer on which photoelectric conversion is performed. The first semiconductor layer 11 and the third semiconductor layer 13 are a combination of p-type and n-type semiconductor layers. The order of stacking the p-type semiconductor layer and the n-type semiconductor layer does not matter. Here, the wording of "stacked on the first semiconductor layer 11" regarding the second semiconductor layer 12 means that the second semiconductor layer 12 is formed on the first semiconductor layer 11, but this expression also includes the case where another layer is present further between the first semiconductor layer 11 and the second semiconductor layer 12. The same applies to the case where the wording of "on" is used for expressing the relationship of the other layers. For example, another semiconductor layer 132 may be included between the third semiconductor layer 13 and the second semiconductor layer 12. Further, the second mesa portion 20 includes a lower side portion 112 of the first semiconductor layer 11.

The materials of the first semiconductor layer 11, the second semiconductor layer 12 and the third semiconductor layer 13 are not limited. The first semiconductor layer 11, the second semiconductor layer 12 and the third semiconductor layer 13 may contain materials such as Al, P, Ga, As, In and Sb. In addition, the ratio of each element can be adjusted as appropriate. As an example, the first semiconductor layer 11, the second semiconductor layer 12 and the third semiconductor layer 13 may be an In compound, which is a compound containing at least In.

The first mesa portion 10 of this infrared light receiving element 100 includes, in order from the substrate 1 side to the top, a first flat portion 101a, a first lateral surface 101b, a second lateral surface 102b, a third lateral surface 103b, and a second flat portion 102a.

The angle formed by the first flat portion 101a and the surface 1a of the substrate 1 is 0° or more and less than 0.6°. The extension of the first flat portion 101a is the boundary between the upper side portion 111 and the lower side portion 112 of the first semiconductor layer 11.

It is preferable that the first flat portion 101a does not have any corrosion holes with a diameter of 1 μm or more, from a viewpoint of coating properties of the insulating film 30 and the first electrode 41.

When the angle formed by the first lateral surface 101b and the surface 1a of the substrate 1 is defined as a first angle $\theta_1$, the first angle $\theta_1$ is 0.6° or more and less than 45°. The first lateral surface 101b is composed only of a part of the lateral surface of the upper side portion 111 of the first semiconductor layer 11. The first lateral surface 101b is located on the side close to the bottom surface of the first mesa portion 10.

When the angle formed by the second lateral surface 102b and the surface 1a of the substrate 1 is defined as a second angle $\theta_2$, the second angle $\theta_2$ is 45° or more and 90° or less. The second lateral surface 102b is composed of the other part of the lateral surface of the upper side portion 111 of the first semiconductor layer 11, the entire lateral surface of the second semiconductor layer 12, and a part of the lateral surface of the third semiconductor layer 13. That is, the second semiconductor layer 12, which is an active layer, is surrounded entirely by the second lateral surface 102b.

When the angle formed by the third lateral surface 103b and the surface 1a of the substrate 1 is defined as a third angle $\theta_3$, the third angle $\theta_3$ is 0.6° or more and less than 45°. The third lateral surface 103b is composed only of the other part of the lateral surface of the third semiconductor layer 13.

The angle formed by the second flat portion 102a and the surface 1a of the substrate 1 is 0° or more and less than 0.6°. The second flat portion 102a is the top portion of the first mesa portion 10.

In this manner, the first mesa portion 10 has at least two flat portions and 3-stage tapered shape.

The length in the direction parallel to the surface 1a of the substrate 1 formed by the second lateral surface 102b is defined as $W_2$, and the length in the direction parallel to the surface 1a of the substrate 1 formed by the third lateral surface 103b is defined as $W_3$. Here, in order to increase the volume of the second semiconductor layer 12, which is an active layer, and improve the light receiving efficiency, $\theta_2$ should be increased and $W_2$ should be reduced. Furthermore, in the manufacturing process of the infrared light receiving element 100, in order to improve the coating properties of the insulating film 30 and the wiring portion 43 on the upper part of the first mesa portion 10, $\theta_3$ should be reduced and $W_3$ should be increased. Therefore, if $W_3/W_2$ is increased, the light receiving efficiency and the coating properties of the insulating film 30 and the wiring portion 43 can be improved at the same time. The $W_3/W_2$ of the infrared light receiving element 100 according to this embodiment is 0.15 or more. The upper limit is not particularly limited, but may be 1.0 or less, and may be 0.65 or less from the viewpoint of the manufacturing process.

The length in the direction parallel to the surface 1a of the substrate 1 formed by the first lateral surface 101b is defined as $W_1$. Here, if $W_1$ is large, the distance between the first contact hole 35 formed on the first flat portion 101a and the second semiconductor layer 12, which is an active layer, is increased, and the percentage of the volume of the active layer in the infrared light receiving element 100 is reduced, and as a result, the light receiving efficiency is reduced. Here, if $W_1/W_2$ is reduced, the percentage of the volume of the active layer in the infrared light receiving element 100 is increased, and the light receiving efficiency can be improved. On the other hand, if $W_1/W_2$ is extremely small, the coating properties of the insulating film 30 is impaired, so it is preferable that $W_1/W_2$ is 0.1 or more. The $W_1/W_2$ of the infrared light receiving element 100 according to this embodiment is 0.2 or more and 3.0 or less. Here, the above description of the light receiving efficiency is applied to the light emitting efficiency of the infrared light emitting element 200, which has the same structure as the infrared light receiving element 100.

The light receiving efficiency is improved when $\theta_2$ is increased and $W_2$ is reduced, but when $\theta_2$ is large, the coating properties of the insulating film 30 and the wiring portion 43 on the second lateral surface 102b are reduced. Thus, it is preferable that $\theta_2$ is 45° or more and 75° or less. The $\theta_2$ of the infrared light receiving element 100 according to this embodiment may be 45° or more and 75° or less.

The shape of the second mesa portion 20 provided below the first mesa portion 10 is not particularly limited. From the second mesa portion 20 to the substrate 1 may be of any shape.

(2) Manufacturing Method

Next, a method of manufacturing the infrared light receiving element 100 illustrated in FIG. 2 will be described.

Figure 3B:
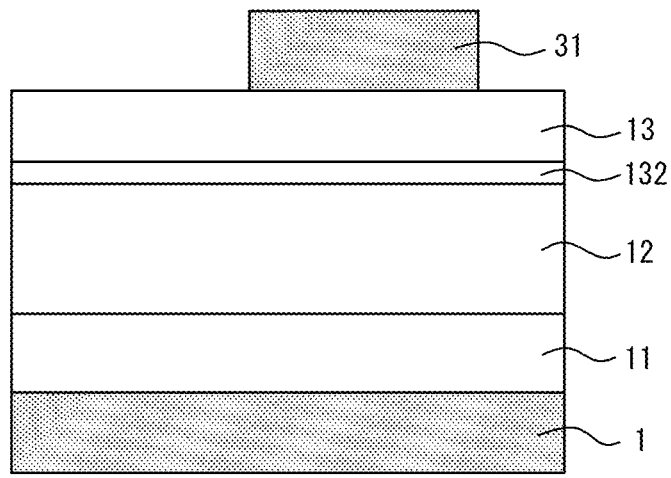
FIG. 3B is a cross-sectional view illustrating a method of manufacturing the infrared device.
Figure 3C:
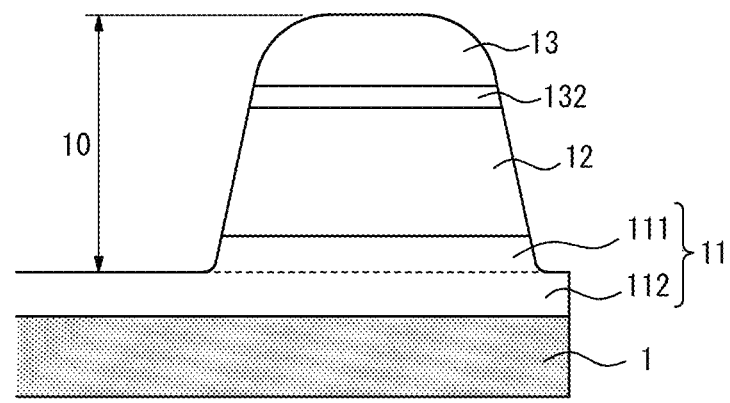
FIG. 3C is a cross-sectional view illustrating a method of manufacturing the infrared device.

FIGS. 3A, 3B and 3C are cross-sectional views illustrating a method of manufacturing the infrared light receiving element 100 according to this embodiment in the order of steps.

(2.1) Step of Stacking Semiconductors

As illustrated in FIG. 3A, first, the first semiconductor layer 11 of first conductive type is formed on the surface side of the substrate 1. Next, the intrinsic second semiconductor layer 12 is formed on the first semiconductor layer 11. Then, the third semiconductor layer 13 of second conductive type is formed on the second semiconductor layer 12. That is, the first semiconductor layer 11, the second semiconductor layer 12 and the third semiconductor layer 13 are deposited in this order on the substrate 1. The deposition of the first semiconductor layer 11, the second semiconductor layer 12 and the third semiconductor layer 13 is continuously performed, for example, in the chamber of the epitaxial growth apparatus while maintaining the preset vacuum level.

(2.2) Step of Forming a First Mesa Portion

Next, as illustrated in FIG. 3B, a resist pattern 31 is formed on the third semiconductor layer 13 using photolithography technology. Before a masking step of forming a mask of a resist pattern 31, a hard mask such as $SiO_2$ may be formed on the third semiconductor layer 13 to prevent the resist pattern 31 from directly contacting the third semiconductor layer 13.

Then, the third semiconductor layer 13, the second semiconductor layer 12 and the upper side portion 111 of the first semiconductor layer 11 are dry etched in order by using the resist pattern 31 as a mask. In this dry etching process, a first etching step in which the interelectrode voltage in the dry etching apparatus is 330 V or more and a second etching step in which the interelectrode voltage is 120 V or more and less than 330 V are continuously performed. In this manner, as illustrated in FIG. 3C, the first mesa portion 10 is formed. Hereinafter, the interelectrode voltage in the etching apparatus in the first etching step is expressed as $V_1$, and the interelectrode voltage in the etching apparatus in the second etching step is expressed as $V_2$.

In this step of forming the first mesa portion 10, as etching gas for etching the third semiconductor layer 13, the second semiconductor layer 12, and the upper side portion 111 of the first semiconductor layer 11, either halogen gas or a gas that contains halogen in its composition (hereinafter referred to as halogen based gas), or a mixture of these gases is used. An example of halogen gas is chlorine gas ($Cl_2$). Further, examples of halogen based gas include hydrogen chloride gas (HCl), hydrogen bromide gas (HBr), and the like.

In the method of manufacturing the infrared light receiving element 100 according to this embodiment, the etching gas does not include a gas having an oxidizing action such as oxygen gas. Thus, in the etching step of forming the first mesa portion 10, the selection ratio between the resist and the semiconductor layer is improved, and disappearance of the resist in the etching step can be prevented.

FIG. 3D illustrates the details of the shape of the first mesa portion 10 in FIG. 3C. If $V_1$ is high, $\theta_2$ can be increased, that is, $W_2$ can be decreased. Further, if $V_2$ is low, $W_3$ can be increased.

Comparative Example 1

Figure 4:
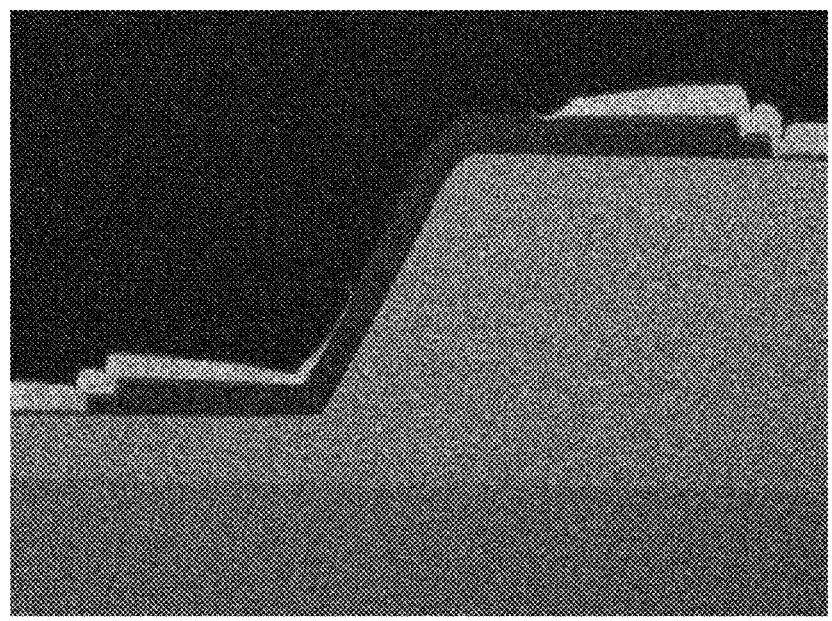
FIG. 4 is a diagram illustrating a cross section of an infrared device produced by a method of Comparative Example 1.

FIG. 4 is an electron micrograph of a cross section of the infrared light receiving element 100 that forms the first mesa portion 10. In Comparative Example 1, a total thickness of 3.6 μm of an InSb n-type semiconductor layer, an intrinsic semiconductor layer and a p-type semiconductor layer were deposited on a GaAs substrate, which was applied with a photoresist "THMR-ip5700HP" manufactured by Tokyo Ohka Kogyo Co., Ltd. to obtain a thickness of 3.5 μm and exposed to form a photoresist pattern. Then, the first etching step was carried out using chlorine gas with $V_1$ set to 740 V, and the second etching process was carried out continuously using chlorine gas with $V_2$ set to 740 V without changing the interelectrode voltage in the dry etching apparatus. The Helios 650 manufactured by FEI was used for electron microscope observation, and observation was performed at an acceleration voltage of 2.0 kV at 20,000-fold magnification.

Figure 5:
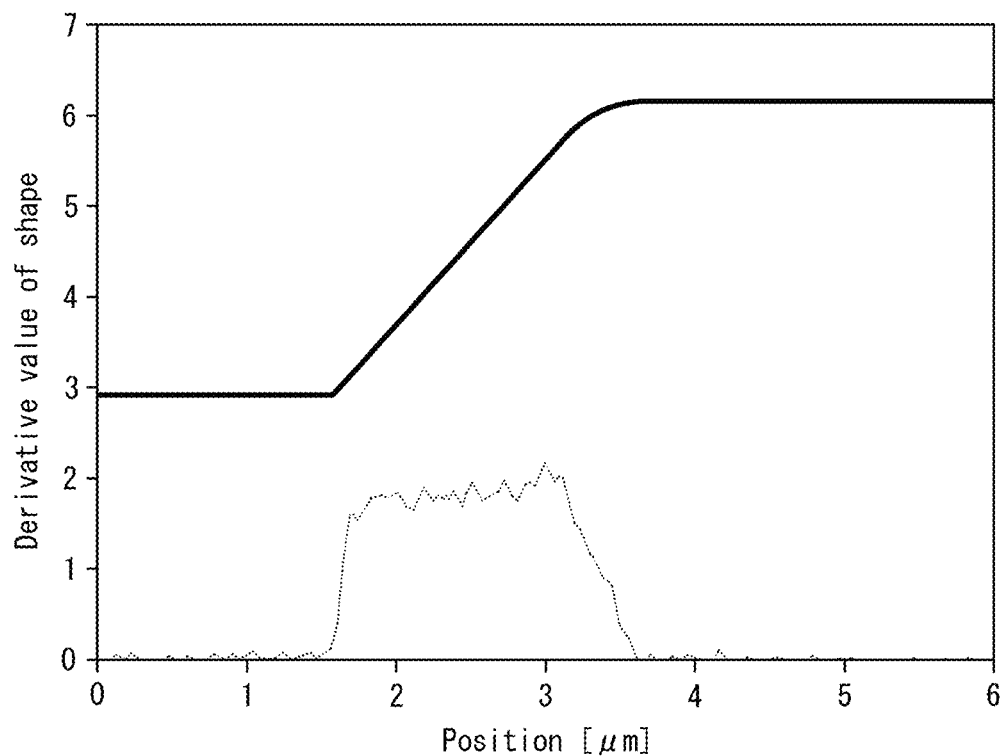
FIG. 5 is a chart illustrating derivative values of a shape of a first mesa portion of the infrared device in FIG. 4.

The solid line in FIG. 5 shows the result of extracting the shape of the surface of the first mesa portion 10 in FIG. 4 with an image processing software, ImageJ (open source software, version 1.52u17 was used). Here, the following [1], [2], [3], and [4] were performed as the procedure for extracting the shape:

[1] The Find Edges process for emphasizing sudden changes in brightness in the electron micrographs;
[2] Gaussian Blur process for smoothing the images. At this time, the standard deviation of the Gaussian function can be set to any value corresponding to the electron micrograph;
[3] Threshold process and Clear process for unnecessary areas other than the shape to be extracted. Only the shape to be extracted was specified as the foreground color; and
[4] Analyze Line Graph process for obtaining the coordinate information of the shape to be extracted that was specified as the foreground color.

Further, the dashed line in FIG. 5 shows the result of differentiating the extracted shape of the surface of the first mesa portion 10 with respect to the direction parallel to the surface 1a of the substrate 1 (hereafter referred to as the derivative values of the shape).

Here, the first lateral surface 101b in the first mesa portion 10 is a part where the first angle $\theta_1$ is 0.6° or more and less than 45°, thus is a part located between the point where the derivative value of the shape will be 0.01 (tan (0.6°)) or more for the first time to the point where it will be 1 (tan (45°)) or more, with respect to the direction of the first mesa portion 10. Since the second lateral surface 102b in the first mesa portion 10 is a part located above the first lateral surface 101b and where the second angle $\theta_2$ is 45° or more and less than 90°, thus is a part located between the end point of the first lateral surface 101b and the point where the derivative value of the shape is less than 1. Since the third lateral surface 103b in the first mesa portion 10 is a part located above the second lateral surface 102b and where the third angle $\theta_3$ is 0.6° or more and less than 45°, thus is a part located between the end point of the second lateral surface 102b and the point where the derivative value of the shape is 0.01 or less with respect to the direction of the first mesa portion 10. In this manner, the start point and the end point of the first lateral surface 101b, the second lateral surface 102b and the third lateral surface 103b can be clearly defined using derivative values of the shape.

The ratio of the length $W_2$ in the direction parallel to the surface 1a of the substrate 1 formed by the second lateral surface 102b and the length $W_3$ in the direction parallel to the surface 1a of the substrate 1 formed by the third lateral surface 103b, $W_3/W_2$, obtained by the above procedure, was 0.14. Further, the ratio of $W_2$ to the length $W_1$ in the direction parallel to the surface 1a of the substrate 1 formed by the first lateral surface 101b, $W_1/W_2$, was 0.90.

Example 1

The infrared light receiving element 100 was obtained in the same manner as in Comparative Example 1 except that $V_2$ was set to 190V.

Figure 6:
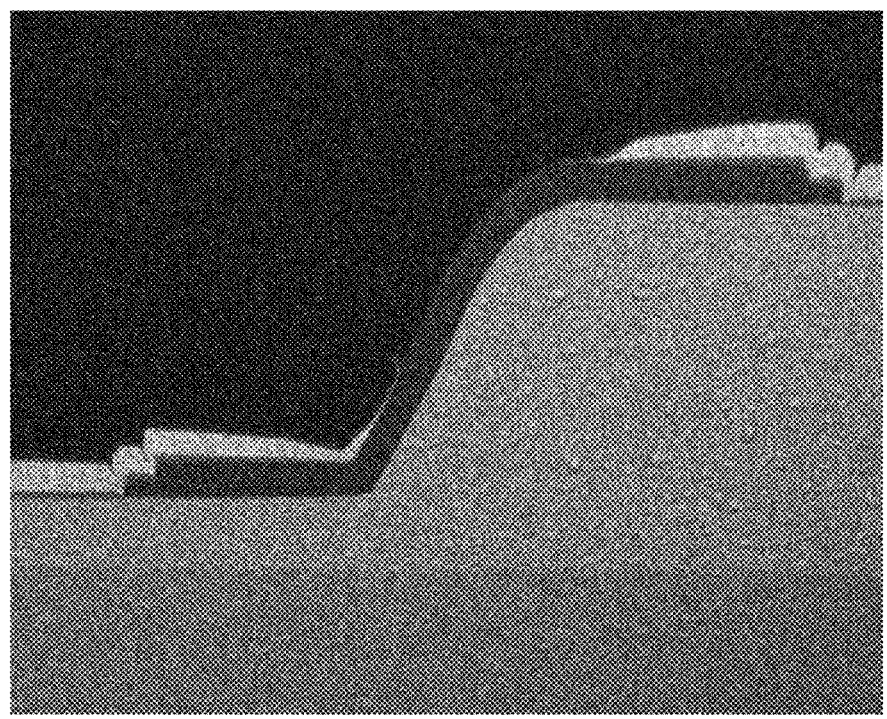
FIG. 6 is a diagram illustrating a cross section of an infrared device produced by a method of Example 1.
Figure 7:
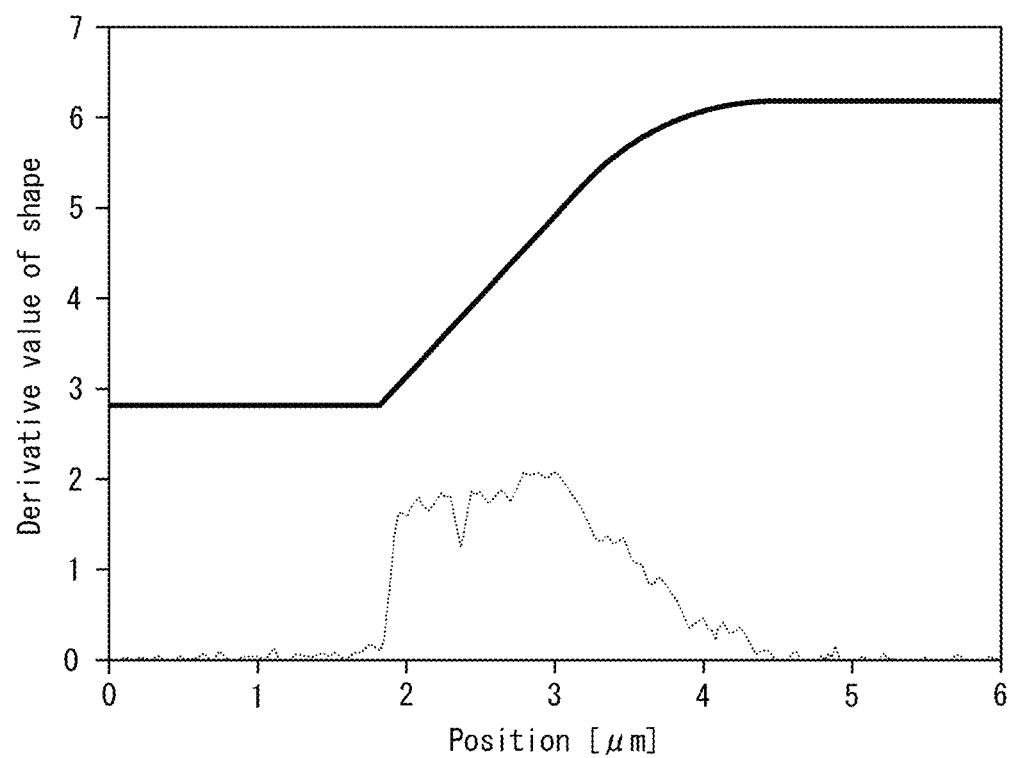
FIG. 7 is a chart illustrating derivative values of a shape of a first mesa portion of the infrared device in FIG. 6.

FIG. 6 is an electron micrograph of a cross section of the infrared light receiving element 100. Further, the solid line in FIG. 7 shows the result of extracting the shape of the surface of first mesa portion 10 in FIG. 6 by the same procedure as in Comparative Example 1 using the image processing software ImageJ. The dashed line in FIG. 7 shows the result of differentiating the shape of the surface of the extracted first mesa portion 10 with respect to the direction parallel to the surface 1a of the substrate 1. At this time, when $W_3/W_2$ was obtained by the same procedure as in Comparative Example 1, $W_3/W_2$ was 0.51. Further, when $W_1/W_2$ was obtained, it was 1.06.

Comparative Example 2

Figure 8:
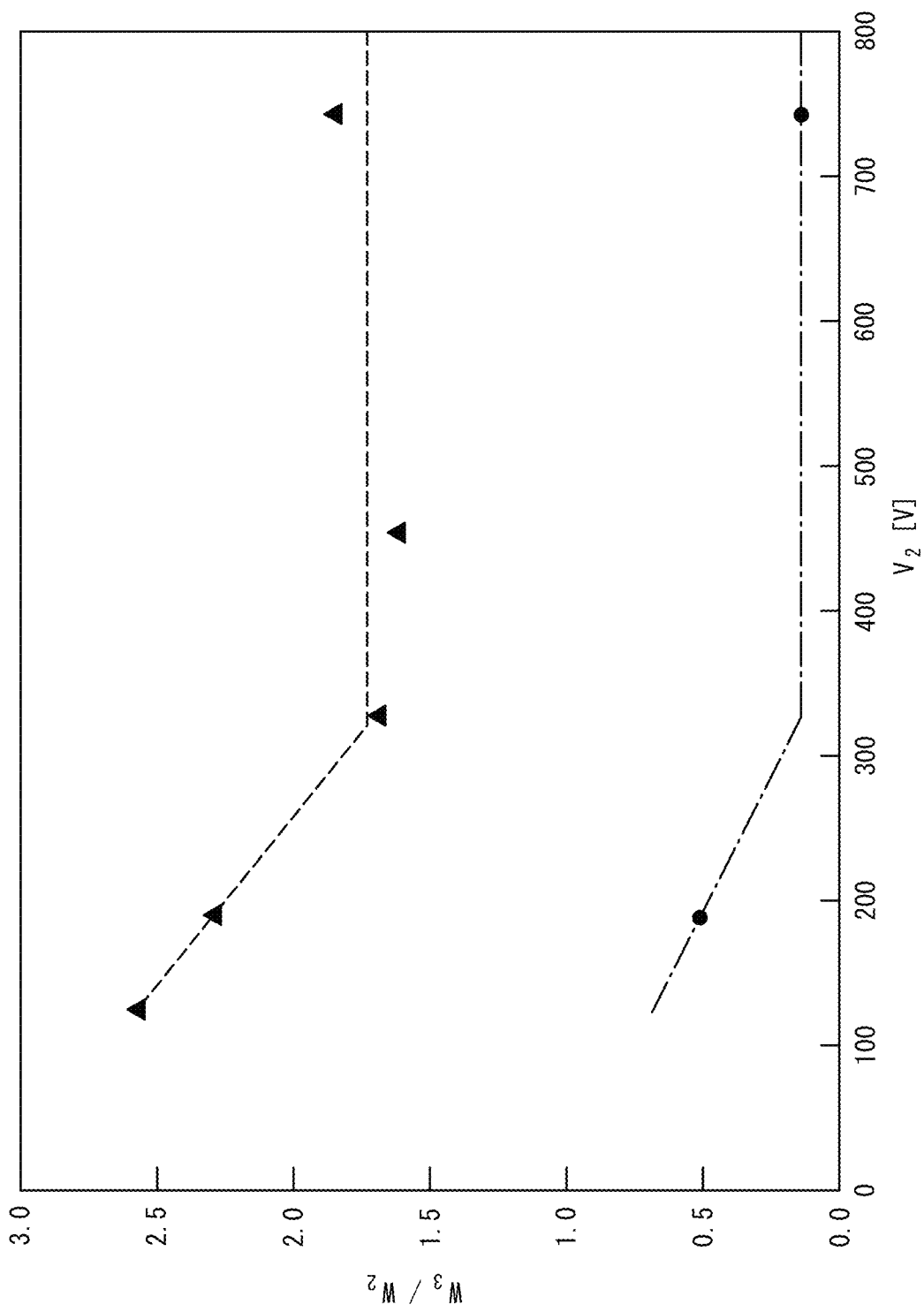
FIG. 8 is a chart in which $W_3/W_2$ is plotted against $V_2$.

The black triangles in FIG. 8 show the results of $W_3'/W_2$ obtained by extracting the shape of the surface by creating the infrared light receiving element 100 in the same manner as in Comparative Example 1, and by scanning the first mesa portion 10 immediately after the dry etching process using a laser microscope OLS4000 manufactured by OLYMPUS. A 100× objective lens was used for scanning the first mesa portion 10. The shooting mode was performed under the condition of high precision mode. When $V_2$ was set to 740 V, $W_3'/W_2'$ obtained by a laser microscopy was 1.86.

Further, the infrared light receiving element 100 was obtained by the same method as in Comparative Example 2 except that $V_2$ was set to 450V and 330V. At this time, $W_3'/W_2'$ obtained by measurement with a laser microscope when $V_2$ was 450 V and 330 V was 1.63 and 1.71.

Example 2

The infrared light receiving element 100 was obtained by the same method as in Comparative Example 2 except that $V_2$ was set to 190V and 120V, and $W_3'/W_2'$ was calculated by a laser microscope in the same manner as in Comparative Example 2. In this case, $W_3'/W_2'$ was 2.29 and 2.57 when $V_2$ was 190V and 120V.

From the results of Comparative Example 2 and Example 2 (black triangles and dashed line in FIG. 8), it can be seen that when $V_2$ is 330V or more, $W_3'/W_2'$ is not dependent on $V_2$, but when $V_2$ is 120V or more and less than 330V, $W_3'/W_2'$ increases linearly with a negative correlation to $V_2$ (dashed line in FIG. 8). Here, considering the result of $W_3/W_2$ obtained from the electron micrograph in Comparative Example 1 (black circle and alternate long and short dash line in FIG. 8), $W_3/W_2$ is 0.14 when $V_2$ is 330 V or more. Further, considering the result of $W_3/W_2$ obtained from the electron micrograph in Example 1, $W_3/W_2$ is at least 0.15 or more when $V_2$ is less than 330 V. Further, since $W_3/W_2$ linearly increases with a negative correlation with $V_2$ in the range where $V_2$ is 120V or more and less than 330V, it can be calculated that $W_3/W_2$ is 0.65 when $V_2$ is 120V (dashed-dotted line in FIG. 8). That is, when $V_2$ is 120V or more and less than 330V, $W_3/W_2$ is 0.15 or more and 0.65 or less.

Figure 9A:
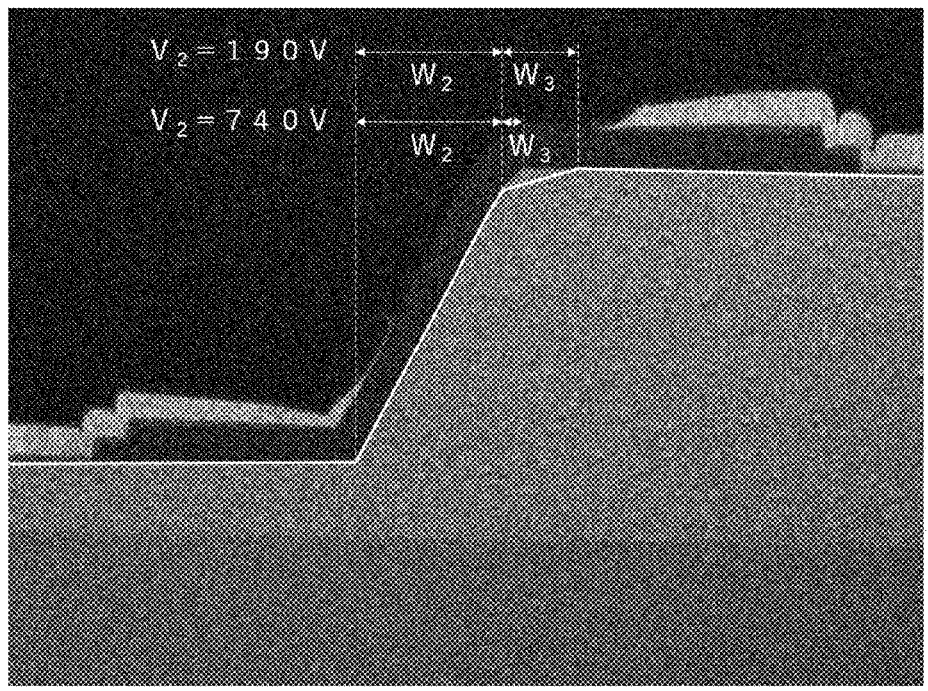
FIG. 9A is a diagram in which shapes of the first mesa portion are compared under each condition of $V_2$.
Figure 9B:
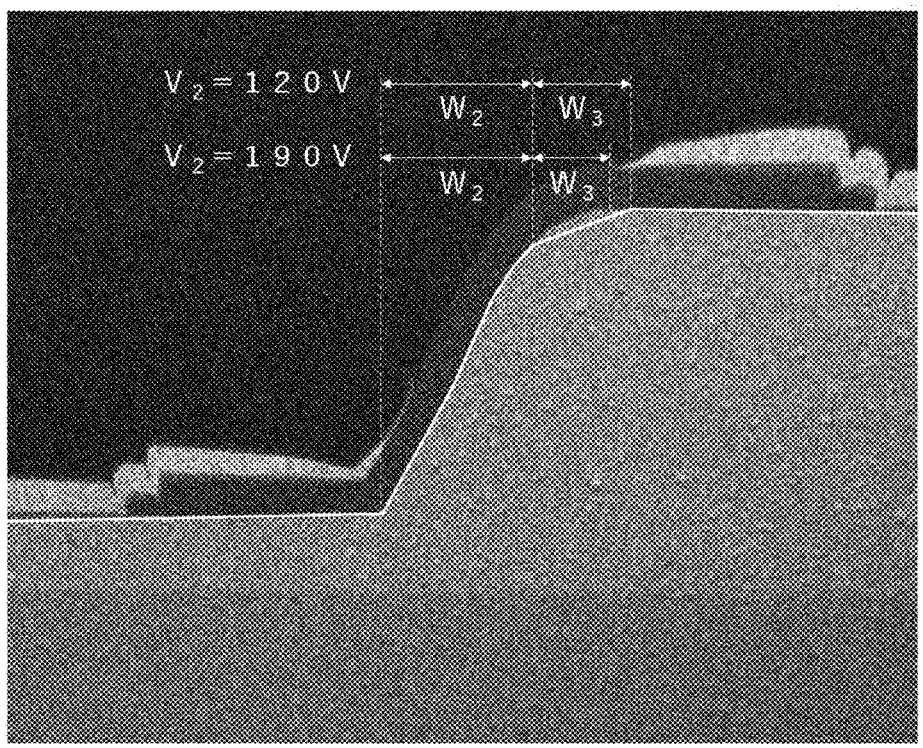
FIG. 9B is a diagram in which shapes of the first mesa portion are compared under each condition of $V_2$.

FIGS. 9A and 9B illustrate the results of comparing the shape of the first mesa portion 10 (electron micrographs in the figures) when $V_2$ is set to 740 V and 190 V, respectively, and the shape of the first mesa portion 10 (white line in the figures) when $V_2$ is set to 190 V and 120 V, respectively, as illustrated in Comparative Example 1. In this manner, when $V_2$ is set to 120V or more and less than 330V, $W_3/W_2$ can be increased.

In any of the above described embodiments, $\theta_2$ is 45° or more and 75° or less. For example, when $V_2$ illustrated in FIG. 9B is 190V, $\theta_2$ is 54°.

Further, in any of the above described embodiments, the surface of the first mesa portion 10 is flat. No corrosion hole with a diameter of 1 μm or more, called etch pit, which is introduced when forming a mesa shape by the wet etching method, is observed.

Effects of this Embodiment

The infrared light receiving element 100 according to this embodiment produces the following effects.

As illustrated in FIG. 2, since the second semiconductor layer 12, which is an active layer, is included in the second lateral surface 102b having a steep slope, the volume of the second semiconductor layer 12 can be increased. Therefore, the efficiency of photoelectric conversion is increased, and the infrared light receiving efficiency can be improved.

In addition, since the third lateral surface 103b with a gentle slope is located on the top of the first mesa portion 10, the coating properties (i.e., step coverage) of the insulating film 30 and the wiring portion 43 at the top of the first mesa portion 10 can be improved.

Further, since $W_3/W_2$, which is the ratio of the length $W_3$ in the direction parallel to the surface 1a of the substrate 1 formed by the third lateral surface 103b, which is located at the upper part of the first mesa portion 10, to the length $W_2$ in the direction parallel to the surface 1a of the substrate 1 formed by the second lateral surface 102b is 0.15 or more and 0.65 or less, the percentage of the volume of the active layer in the infrared light receiving element 100 can be increased. Therefore, the efficiency of photoelectric conversion is increased, and the infrared light receiving efficiency can be improved.

Further, since $W_1/W_2$, which is the ratio of the length $W_1$ in the direction parallel to the surface 1a of the substrate 1 formed by the first lateral surface 101b, which is located at the lower part of the first mesa portion 10, to the length $W_2$ in the direction parallel to the surface 1a of the substrate 1 formed by the second lateral surface 102b is 0.2 or more and 3.0 or less, the percentage of the volume of the active layer in the infrared light receiving element 100 can be increased. Therefore, the efficiency of photoelectric conversion is increased, and the infrared light receiving efficiency can be improved.

Further, the infrared light emitting element 200 according to this embodiment having the same structure as the infrared light receiving element 100 produces the above described effects in the same manner as the infrared light receiving element 100. However, the "light receiving efficiency" in the above effect is replaced with the "light emitting efficiency."

The invention claimed is:

1. An infrared device comprising a first mesa portion that includes a first semiconductor layer of first conductive type provided on one face side of a substrate, a second semiconductor layer serving as an active layer stacked on the first semiconductor layer, and a third semiconductor layer of second conductive type stacked on the second semiconductor layer, wherein:
   a lateral surface of the first mesa portion is composed of a first flat portion, a first lateral surface, a second lateral surface, a third lateral surface, and a second flat portion in order from a substrate side to a top side, the first lateral surface is located on a side close to a bottom surface of the first mesa portion, the second lateral surface is located above the first lateral surface, and the third lateral surface is located above the second lateral surface;
   a first angle formed by the first lateral surface and one face of the substrate is 0.6° or more and less than 45°, a second angle formed by the second lateral surface and one face of the substrate is 45° or more and 90° or less, and a third angle formed by the third lateral surface and one face of the substrate is 0.6° or more and less than 45°; and
   wherein a length of the first lateral surface measured entirely in a direction parallel to a surface of the substrate is defined as $W_1$, a length of the second lateral surface measured entirely in the direction parallel to the surface of the substrate is defined as $W_2$, and a length of the third lateral surface measured entirely in the direction parallel to the surface of the substrate is defined as $W_3$, $W_3/W_2$ is 0.15 or more and $W_1/W_2$ is 0.2 or more and 3.0 or less.

2. The infrared device according to claim 1, wherein
   the first lateral surface is a part of a lateral surface of an upper side portion of the first semiconductor layer;
   the second lateral surface is the other part of the lateral surface of the upper side portion of the first semiconductor layer, the entire lateral surface of the second semiconductor layer, and a part of the lateral surface of the third semiconductor layer; and
   the third lateral surface is the other part of the lateral surface of the third semiconductor layer.

3. The infrared device according to claim 1, wherein the $W_3/W_2$ is 0.15 or more and 1 or less.

4. The infrared device according to claim 1, wherein the second angle is 45° or more and 75° or less.

5. The infrared device according to claim 1, wherein the first semiconductor layer, the second semiconductor layer and the third semiconductor layer include Al, P, Ga, As, In or Sb.

6. The infrared device according to claim 1, wherein the first semiconductor layer, the second semiconductor layer and the third semiconductor layer are an In compound.

7. The infrared device according to claim 1, wherein no corrosion hole with a diameter of 1 μm or more is present in a first flat portion provided on a lower side portion of the first semiconductor layer.

8. The infrared device according to claim 1, wherein
the length of the first lateral surface measured all the way from one end of the first lateral surface to the other end thereof in a direction parallel to a surface of the substrate is defined as $W_1$, the length of the second lateral surface measured all the way from one end of the second lateral surface to the other end thereof in the direction parallel to the surface of the substrate is defined as $W_2$, and the length of the third lateral surface measured all the way from one end of the third lateral surface to the other end thereof in the direction parallel to the surface of the substrate is defined as $W_3$.

9. The infrared device according to claim 1, wherein
the lateral surface of the first mesa portion is composed of the first flat portion, the first lateral surface, the second lateral surface, the third lateral surface, and the second flat portion in order from the substrate side to the top side without a gap.

10. The infrared device according to claim 1, wherein
an angle formed by the first flat portion and one face of the substrate is 0° or more and less than 0.6°, and an angle formed by the second flat portion and one face of the substrate is 0° or more and less than 0.6°.

\* \* \* \* \*